(12) United States Patent
Lee et al.

(10) Patent No.: US 7,855,145 B2
(45) Date of Patent: Dec. 21, 2010

(54) GAP FILLING METHOD AND METHOD FOR FORMING SEMICONDUCTOR MEMORY DEVICE USING THE SAME

(75) Inventors: Jin-Il Lee, Seongnam-si (KR);
Choong-Man Lee, Seoul (KR);
Sung-Lae Cho, Yongin-si (KR);
Sang-Wook Lim, Yongin-si (KR);
Hye-Young Park, Seongnam-si (KR);
Young-Lim Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 614 days.

(21) Appl. No.: 11/783,975

(22) Filed: Apr. 13, 2007

(65) Prior Publication Data

US 2007/0246439 A1    Oct. 25, 2007

(30) Foreign Application Priority Data

Apr. 24, 2006   (KR) ...................... 10-2006-0036699

(51) Int. Cl.
*H01L 21/44* (2006.01)
(52) U.S. Cl. ...................... 438/672; 438/102; 438/761; 438/763
(58) Field of Classification Search ...................... 257/2, 257/3, 4; 438/95, 102, 103, 694, 695, 672, 438/761, 763
See application file for complete search history.

(56) References Cited

U.S. PATENT DOCUMENTS

| 6,855,975 | B2 | 2/2005 | Gilton |
| 6,872,963 | B2 | 3/2005 | Kostylev et al. |
| 6,908,862 | B2* | 6/2005 | Li et al. ...................... 438/700 |
| 2002/0168852 | A1* | 11/2002 | Harshfield et al. .......... 438/650 |
| 2005/0159007 | A1* | 7/2005 | Chen et al. .................. 438/700 |
| 2005/0227496 | A1 | 10/2005 | Park et al. |
| 2006/0006472 | A1 | 1/2006 | Jiang |

FOREIGN PATENT DOCUMENTS

| KR | 10-2002-0092682 A | 12/2002 |
| KR | 10-2005-0099589   | 10/2005 |
| KR | 10-2005-0104074 A | 11/2005 |

OTHER PUBLICATIONS

R-Y Kim et al, "Structural properties of Ge2Sb2Te5 thin films by metal organic chemical vapor deposition for phase change memory applications", 2006, Applied Physics Letters, vol. 89, 102107.*

* cited by examiner

*Primary Examiner*—David Vu
*Assistant Examiner*—Suberr Chi
(74) *Attorney, Agent, or Firm*—Lee & Morse, P.C.

(57) ABSTRACT

A gap filling method and a method for forming a memory device, including forming an insulating layer on a substrate, forming a gap region in the insulating layer, and repeatedly forming a phase change material layer and etching the phase change material layer to form a phase change material layer pattern in the gap region.

14 Claims, 8 Drawing Sheets

GAP FILLING METHOD AND METHOD FOR FORMING SEMICONDUCTOR MEMORY DEVICE USING THE SAME

BACKGROUND OF THE INVENTION

1. Field of the Invention

The present invention relates to a device having a gap. More particularly, the present invention pertains to a method of filling a gap and a method for forming a memory device using the same.

2. Description of the Related Art

Semiconductor memory devices may be classified into volatile memory devices and nonvolatile memory devices according to whether stored data is retained even when power is turned off. A phase change memory device is a type of a nonvolatile memory device under development as a next generation memory device which may replace a flash memory device. The phase change memory device may include a phase change material, e.g., a chalcogenide, that may be maintained at one of a crystalline state or an amorphous state by heating or cooling to change the state by a phase transition. The phase change material may have a low resistance in a crystalline state and a high resistance in an amorphous state. A logic value of the phase change memory device may be determined to a binary 0 or 1 depending on a resistance value of the phase change material. The crystalline state of the phase change material may correspond to a set or logic 0, and the amorphous state thereof may correspond to a reset or logic 1.

FIGS. 1A through 1C illustrate sectional views of a semiconductor substrate of stages of a method for forming a phase change memory device according to related art.

Referring to FIGS. 1A through 1C, a phase change material layer 30 and an upper electrode layer 40 may be formed on a semiconductor substrate 10 in which a lower electrode 25 is contained. The phase change material layer 30 and the upper electrode layer 40 may be patterned to form a phase change material layer pattern 35 and an upper electrode 45. An interlayer insulating layer 50 may be formed to cover an entire surface of the substrate 10. A contact plug 55 may be formed to penetrate the interlayer insulating layer 50 and contact the upper electrode 45. A line 60 may be formed on the interlayer insulating layer 50 to be electrically connected with the contact plug 55.

The photolithography and etching processes illustrated in FIGS. 1A through 1C may limit the phase change material layer pattern 35 to a width D1 of about 100 nm or less. Also, since the width D1 of the phase change material layer pattern 35 may be larger than a width D2 of the lower electrode 25, the phase change material layer pattern 35 may contact an entire upper surface of the lower electrode 25. That is, the width of the phase change material layer pattern 35 may be large, and a contact area between the phase change material layer pattern 35 and the lower electrode 25 may also be large. Therefore, when the phase change material layer pattern 35 is heated or cooled to change to the crystalline state or the amorphous state, a large amount of power may be consumed with an accompanying large heat loss. This phenomenon may lower the operation characteristics of the phase change memory device.

SUMMARY OF THE INVENTION

The present invention is therefore directed to a gap filling method that forms a minute sized phase change material layer pattern and a method for forming a memory device using the gap filling method, which substantially overcome one or more of the problems due to the limitations and disadvantages of the related art.

It is therefore a feature of an embodiment of the present invention to provide a gap region of 100 nm or less which may be filled without voids.

It is therefore a feature of an embodiment of the present invention to provide a memory device with an enhanced operation characteristic.

At least one of the above and other features and advantages of the present invention may be realized by providing a method for filling a gap which may include forming an insulating layer on a substrate, forming a gap region in the insulating layer, and repeatedly forming a phase change material layer and etching the phase change material layer on an entire surface of the substrate, thereby forming a phase change material layer pattern in the gap region.

The forming a phase change material layer and etching the phase change material layer may be performed in situ. The repeatedly forming a phase change material layer and etching the phase change material layer are performed in a plasma processing apparatus, and may include supplying a process gas and a source gas to a process chamber of the plasma processing apparatus, and independently supplying a voltage to an upper electrode and a lower electrode respectively located in an upper portion and a lower portion of the process chamber. A power of about 100 W or less may be provided to the upper electrode and the lower electrode is grounded during forming the phase change material layer, and a power higher than the power provided to the upper electrode may be provided to the lower electrode during etching the phase change material layer. A thickness of the formed phase change material layer may be increased with increasing repetitions of forming the phase change material layer and etching the phase change material layer.

At least one of the above and other features and advantages of the present invention may be realized by providing a method for forming a memory device which may include forming a first interlayer insulating layer having a conductive plug on a substrate, forming a second interlayer insulating layer on the first interlayer insulating layer, patterning the second interlayer insulating layer to form an opening exposing the conductive plug, and repeatedly forming a phase change material layer and etching the phase change material layer to form a phase change material layer pattern in the opening.

The repeatedly forming a phase change material layer and etching the phase change material layer may be performed in situ. A thickness of the formed phase change material layer may be increased with increasing repetitions of forming a phase change material layer and etching the phase change material layer. The phase change material layer may be at least one of Ge, Te, or Sb. Forming a plasma in the process chamber may use at least one of Ar, He, or $H_2$ as the process gas. The process gas may be used as an etching gas in the etching process. The source gas may include a first precursor containing Ge, a second precursor containing Sb, and a third precursor containing Te. The first precursor may be Ge(isobutyl)$_3$H or GeH$_4$, the second precursor may be Sb(iso-propyl)$_3$, and the third precursor may be Te(t-butyl)$_3$. The source gas may be repeatedly supplied in an order of the first precursor, the third precursor, the second precursor, and the third precursor. A power of about 100 W or less may be provided to the upper electrode and the lower electrode is grounded during forming the phase change material layer, and a power higher than the power provided to the upper electrode may be provided to the lower electrode during etching the phase change material layer.

At least one of the above and other features and advantages of the present invention may be realized by providing a semiconductor memory device which includes a substrate, an insulating layer on the substrate, a gap of 100 nm or less in the insulating layer, a first phase change material layer in the gap, and a second phase change material layer on the first phase change material layer, wherein the second phase change material layer may have a larger thickness than a thickness of the first phase change material layer.

A third phase change material layer may be on the second phase change material layer, where the third phase change material layer may have a larger thickness than the thickness of the second phase change material layer. A conductive region may be in the substrate, the conductive region contacting the first phase change material layer. The gap may be filled without voids.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
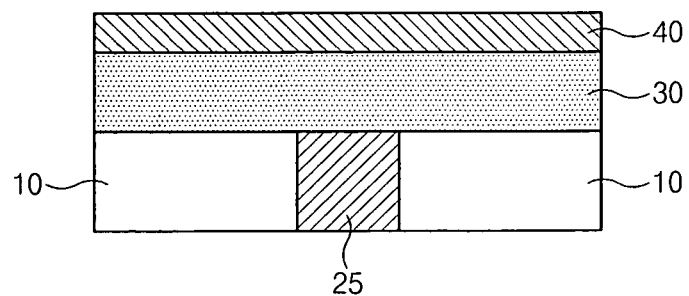
FIGS. 1A through 1C illustrate sectional views of stages of a method for forming a phase change memory device.
Figure 1B:
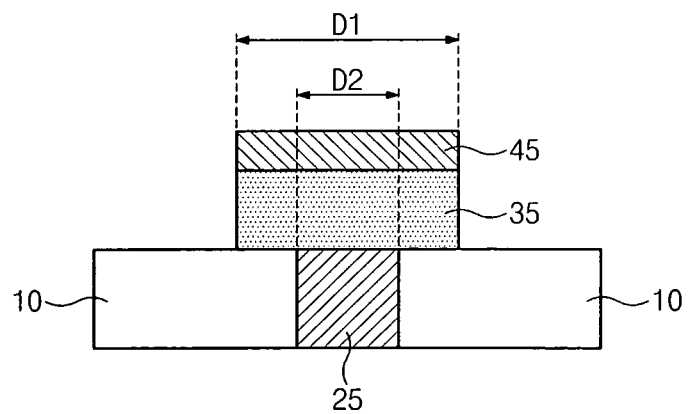
Figure 1C:
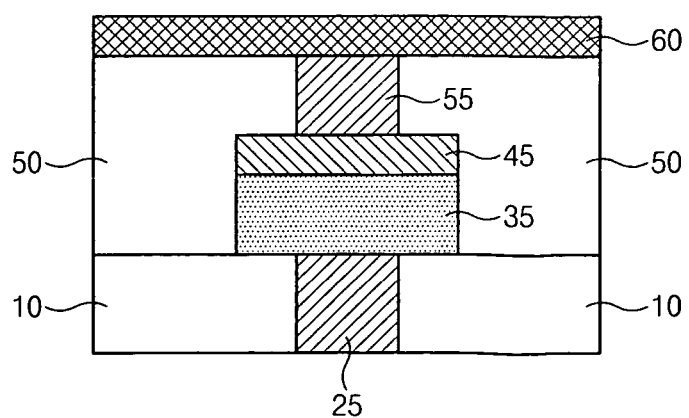

Korean Patent Application No. 2006-36699, filed on Apr. 24, 2006, in the Korean Intellectual Property Office, and entitled: "Gap Fill Method and Method for Forming Semiconductor Memory Device Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be also understood that, although the terms "first," "second," and the like may be used herein to describe material layer patterns, interlayer insulating layers, and the like, these material layer patterns and interlayer insulating layers should not be limited by these terms. These terms are only used to distinguish one material layer pattern and interlayer insulating layer from another material layer pattern and interlayer insulating layer. In the drawing figures, the dimensions of layers and regions are exaggerated for clarity of illustration.

According to an embodiment of the present invention, a gap region of 100 nm or less may be filled without voids.

According to an embodiment of the present invention, a highly integrated semiconductor memory device with an enhanced operation characteristic may be formed.

FIGS. 2 through 7 illustrate sectional views of stages a semiconductor gap filling method according to an embodiment of the present invention.

Figure 2:
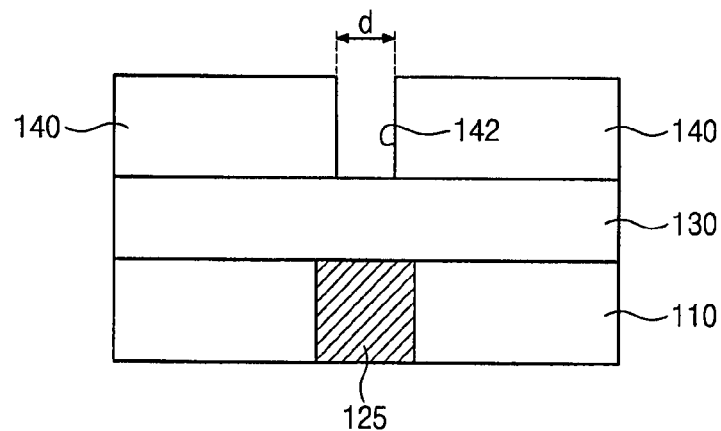
FIGS. 2 through 7 illustrate sectional views of stages of a gap filling method according to an embodiment of the present invention.

Referring to FIG. 2, an insulating layer 130 may be formed on a semiconductor substrate 110 including a conductive region 125. A photoresist pattern 140 may be formed on the insulating layer 130. The photoresist pattern 140 may include an intaglio pattern 142 having a predetermined width d. The width d of the intaglio pattern 142 may be decreased due to the flow of photoresist during heat treatment, e.g., a hard bake, after a photolithography process and a developing process for forming the photoresist pattern 140. For example, the width d of the intaglio pattern 142 may be decreased to about 100 nm or less.

Figure 3:
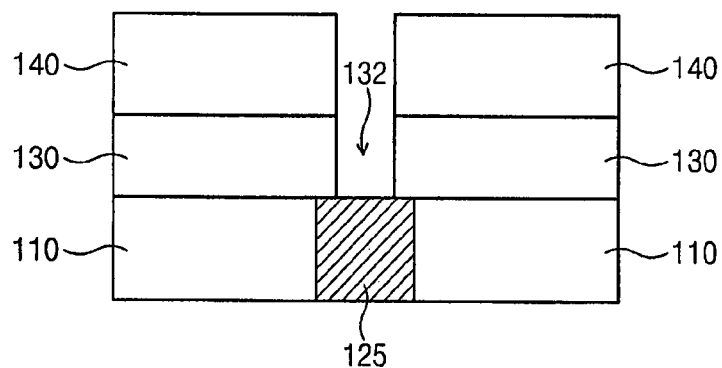

Referring to FIG. 3, an etching process may be performed using the photoresist pattern 140 as an etch mask to form a gap region 132 in a predetermined region of the insulating layer 130. The gap region 132 may penetrate the insulating layer 130 to expose the conductive region 125. The gap region 132 may alternately be formed in only an upper portion without penetrating the insulating layer 130. Anisotropic etching may be used in the etching process. The gap region 132 may have a width of about 100 nm or less. Any suitable anisotropic etching process may be used, e.g., plasma etch, reactive ion etch (RIE), etc.

Figure 4:
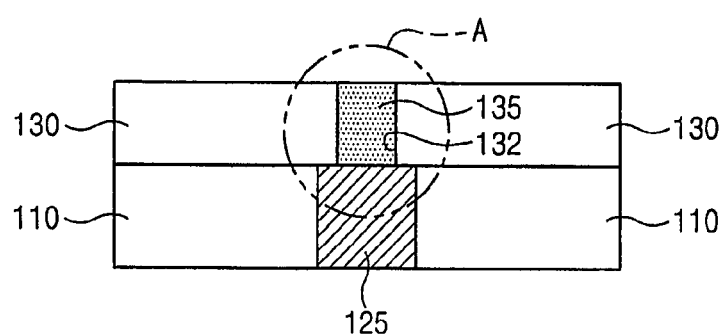

Referring to FIG. 4, the photoresist pattern 140 may be removed, e.g., by an ashing process, and then a phase change material layer pattern 135 may be formed in the gap region 132. The process for forming the phase change material layer pattern 135 (that is, the gap filling process of the gap region) will be described in detail with reference to FIGS. 5 through 9.

Figure 5:
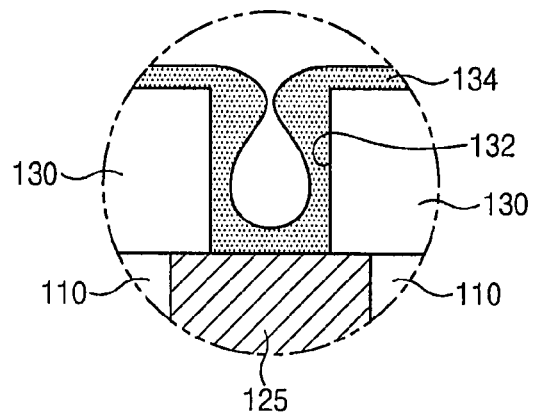
Figure 6:
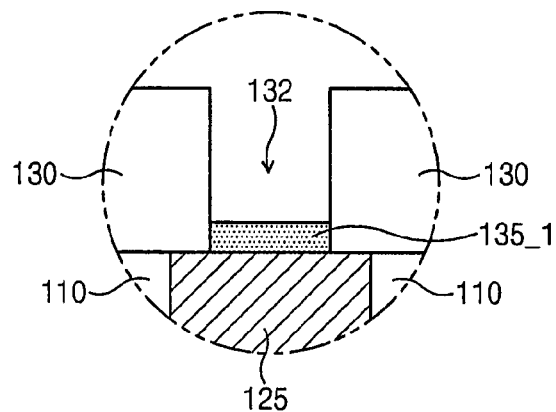
Figure 7:
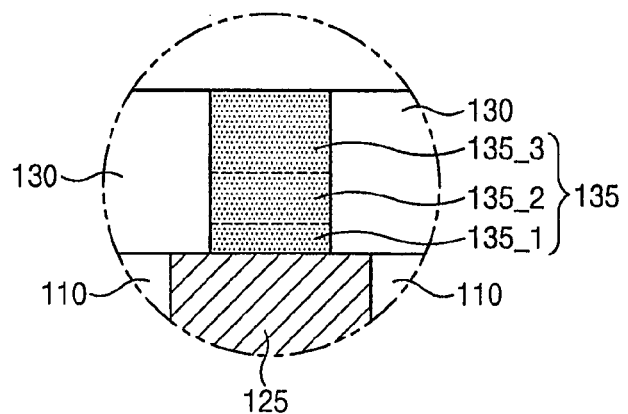
Figure 8:
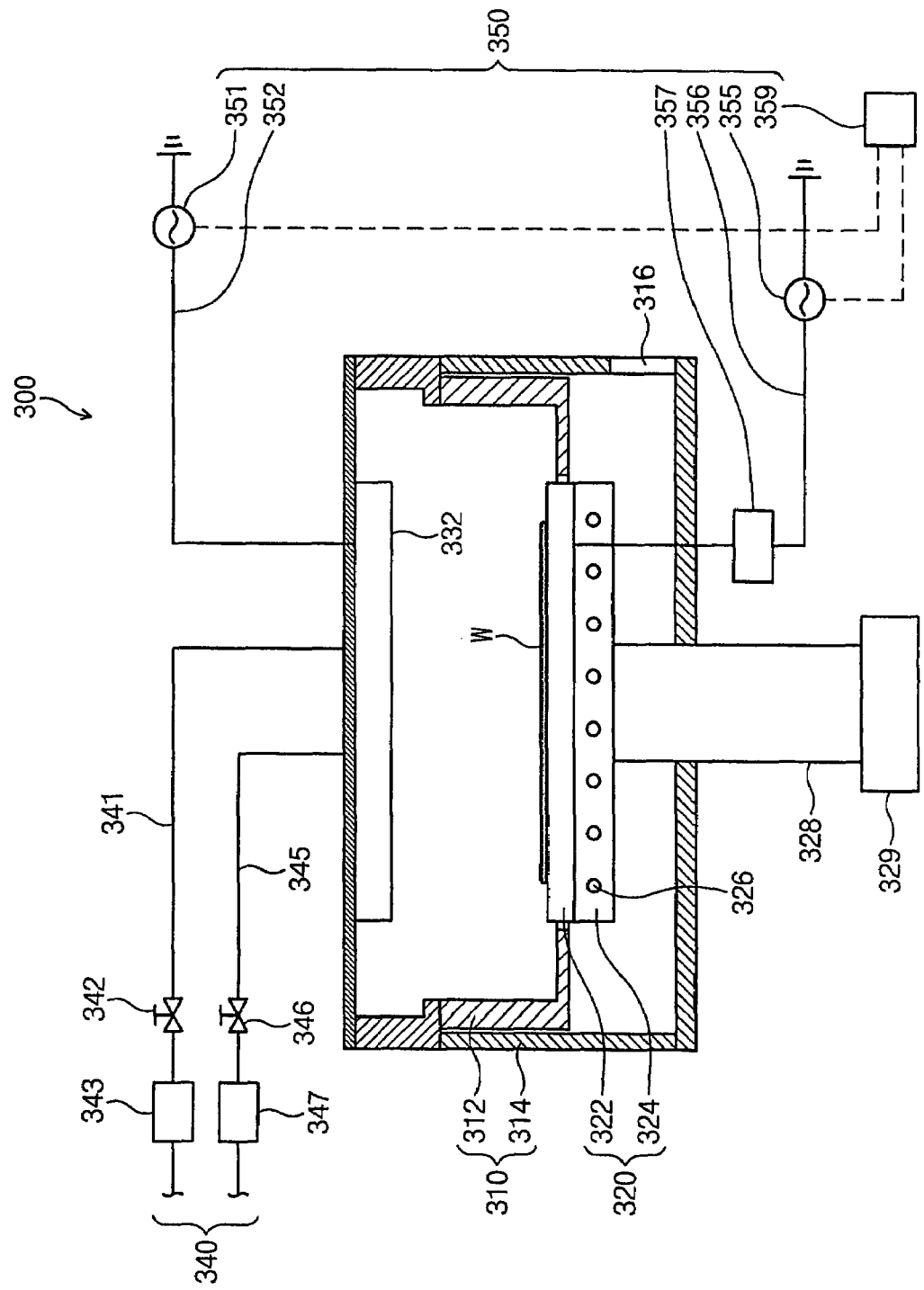
FIG. 8 illustrates a schematic view of a plasma processing apparatus according to an embodiment of the present invention.
Figure 9:
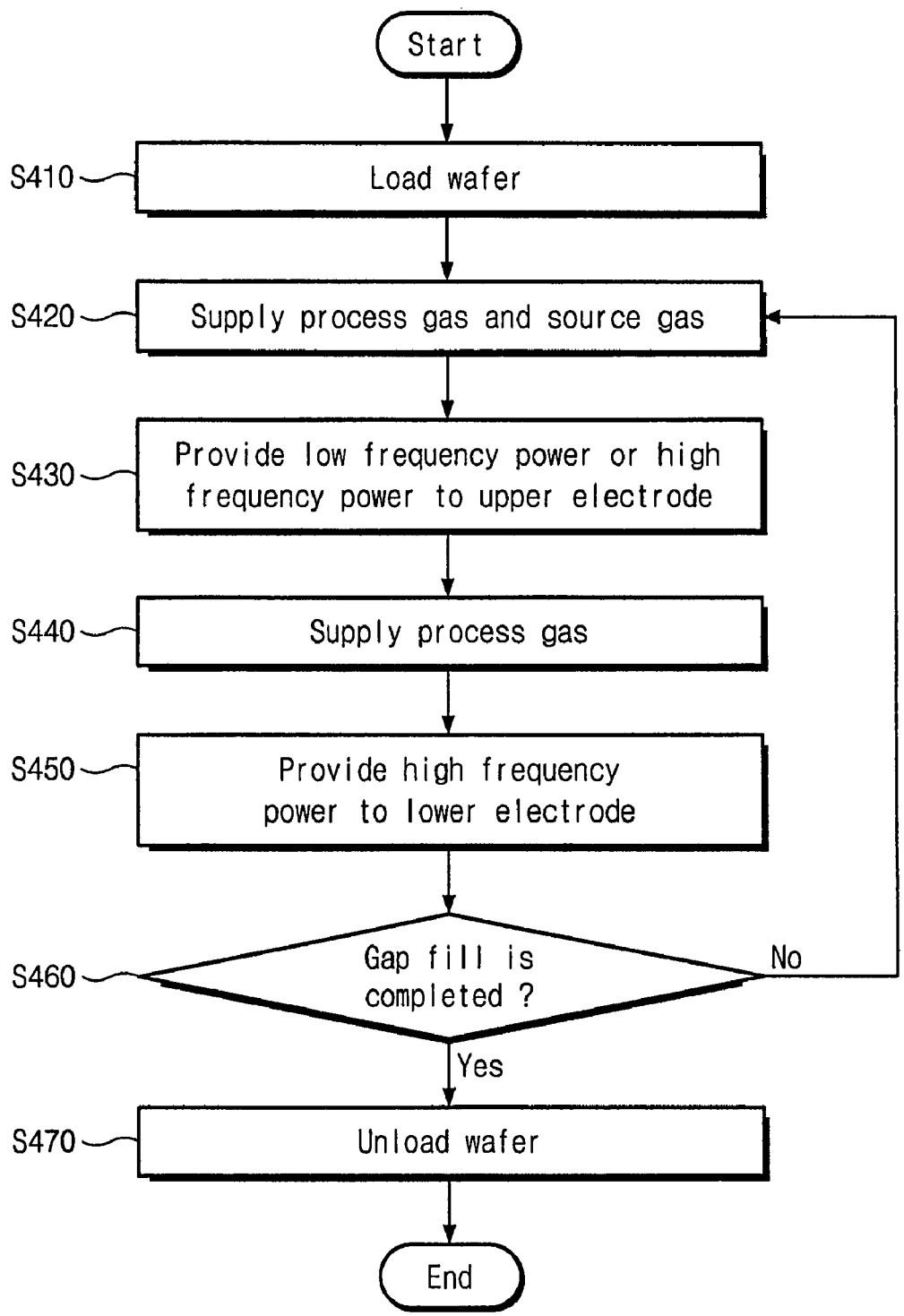
FIG. 9 illustrates a flow chart of stages of a gap filling method according to an embodiment of the present invention.

FIGS. 5 through 7 illustrate enlarged views of the circled A region of FIG. 4. FIG. 8 illustrates a schematic view of a plasma processing apparatus according to an embodiment of the present invention. FIG. 9 illustrates a flow chart of stages in a gap filling method according to an embodiment of the present invention.

Referring to FIG. 8, a plasma processing apparatus 300 generally may include a process chamber 310, an upper electrode 332, a lower electrode 322, a gas supply unit 340, and a plasma generating unit 350.

The process chamber 310 may include a processing chamber 312, in which a process may be performed, and a housing 314 surrounding the processing chamber 312. The processing chamber 312 may be in an upper portion of the housing 314. The housing 314 may include a port 316 as a passage through which a wafer W moves in a lower portion of a sidewall of the processing chamber 312.

A substrate support unit 320 on which the wafer W is placed may be in a central portion of a bottom surface of the processing chamber 312. The substrate support unit 320 may include the lower electrode 322 and a support plate 324. The support plate 324 may include a heating member 326 mounted therein, i.e., a heater. A heat plate or a coiled heating wire may be used as the heater. A bottom surface of the support plate 324 may be coupled to a transfer shaft 328, and the transfer shaft 328 may be coupled to a driving unit 329. The driving unit 329 may allow the transfer shaft 328 to rotate or move vertically. The vertical movement of the transfer shaft 328 may be accomplished by a hydraulic pneumatic cylinder, or selectively by a mechanism including a motor to accurately control a position.

The gas supply unit 340 may include gas supply tubes 341 and 345, opening/closing valves 342 and 346, and flow controllers 343 and 347. The flow controllers 343 and 347 may be mass flow controllers. The gas supply tubes 341 and 345 may supply a process gas or a source gas into the process chamber 310 from an external gas storage (not shown). The gas supply tubes 341 and 345 may be provided in multiples, and each of the gas supply tubes 341 and 345 may supply different kinds of gases. For example, the gas supply tube 341 may supply a process gas and the gas supply tube 345 may supply a source gas. The process gas may be supplied to generate a plasma in the process chamber 310, which may be used as an etching gas during the etching process. The source gas may be supplied to form a thin layer on the wafer W. That is, in the process chamber 310, both the process gas and the source gas may be supplied to perform a thin layer forming process, but only the process gas may be supplied while performing the etching process. The opening/closing valves 342 and 346, for opening and closing the gas supply tubes 341 and 345, and the flow controllers 343 and 347, for controlling a flow of the supplied gas, may be installed in-line or teed into the gas supply tubes 341 and 345.

The upper electrode 332 and the lower electrode 322 may be arranged in an upper portion and a lower portion of the process chamber 310, respectively. The upper electrode 332 may include a through hole (not shown) through which the process gas and the source gas may be injected into the process chamber 310. The lower electrode 322 may be located on the support plate 324.

The plasma generating unit 350 may generate a plasma of the process gas supplied to the process chamber 310. The plasma generating unit 350 may include a low frequency generator 351 and a high frequency generator 355 independently supplying a voltage to the upper electrode 332 and the lower electrode 322. The low frequency generator 351 may provide low frequency power to the upper electrode 332 connected with a low frequency line 352. The high frequency generator 355 may provide high frequency power to the lower electrode 322 connected with a high frequency line 356.

The plasma generating unit 350 may further include a matching unit 357 located between the high frequency generator 355 and the lower electrode 322. The matching unit 357 may allow the high frequency power generated from the high frequency generator 355 to be provided to the lower electrode 322 in an optimized state without any loss. In an embodiment of the present invention, the low frequency power may be provided to the upper electrode 332, but the high frequency power may also be provided to the upper electrode 332. In this case, the matching unit 357 may be further disposed between the upper electrode 332 and the high frequency generator 355. However, different configurations of the power can be used such that either low or high frequencies may be provided to either of the upper electrode 332 or the lower electrode 322.

The plasma generating unit 350 may further include a control unit 359 for controlling the low frequency generator 351 and the high frequency generator 355. The control unit 359 may operate the low frequency generator 351 to provide low power of, e.g., about 100 W or less, to the upper electrode 332 when depositing the phase change material on the wafer W in the process chamber 310. Here, the lower electrode 322 may be grounded. Also, the control unit 359 may operate both the low frequency generator 310 and the high frequency generator 355 to provide power to the upper electrode 332 and the lower electrode 322 when the etching process is performed in the process chamber 310. In order to smoothly perform the etching process, higher power may be provided to the lower electrode 322 than the upper electrode 332. The power may be independent of the frequency used. That is, the low frequency generator and/or the high frequency generator to be operated may be selected according to the kind of a process performed in the process chamber 310.

Referring to FIGS. 5, 8, and 9, before performing the gap filling process, an upper surface of the substrate support unit 320 may be placed under an atmosphere in the processing chamber 312 located in the housing 314. The wafer W may be loaded onto the substrate support unit 320 by a transfer robot (not shown) through the port 316 (S410). Next, the substrate support unit 320 may rise and an upper surface thereof may move to a process position in the processing chamber 312. The plasma processing apparatus 300 may further include a fixing member for fixing the wafer W on the substrate support unit 320 in the processing chamber 312.

A thin layer forming process may be performed on a surface of the wafer W.

The process gas and the source gas may be supplied into the process chamber 310 (S420), and the low frequency power or the high frequency power may be supplied to the upper electrode 332 (S430). Here, the lower electrode 322 may be grounded.

The process gas may include at least one of Ar, He, or $H_2$ to form a plasma in the process chamber 310. The process gas to be supplied may include, e.g., $H_2$ at about 10 to 300 sccm, and one of He and Ar, or a mixed gas of He and Ar, at about 0 to 500 sccm. The source gas may be supplied at about 10 to 300 sccm. The process gas may be used as an etching gas during the etching process. An internal pressure of the process chamber may be maintained at, e.g., about 1.5 to 5.0 mT, and a deposition temperature of the phase change material layer may be about 500° C. or less.

The source gas may include at least one of a first precursor containing Ge, a second precursor containing Sb, or a third precursor having Te. The first precursor may be, e.g., Ge(iso-butyl)$_3$H or GeH$_4$, the second precursor may be, e.g., Sb(iso-propyl)$_3$, and the third precursor may be, e.g., Te(t-butyl)$_3$.

When the thin layer forming process is performed, the first precursor, the third precursor, the second precursor, and the third precursor may be repeatedly supplied in order. The first precursor may be supplied for, e.g., about 0.5 seconds, the third precursor for, e.g., about 1 second, the second precursor for, e.g., about 0.4 seconds, and the third precursor for, e.g., about 1 second. When this type of process is repeated approximately 100 to 200 times, the phase change material layer of $Ge_2Sb_2Te_5$ may be formed to cover a bottom and sides of the gap region 132 and an upper surface of the insulating layer 130. Here, the phase change material layer 134 may have an overhang shape in an upper portion of the gap region 132 (see FIG. 5).

Referring to FIGS. 6, 8, and 9, the etching process may be performed on the phase change material layer 134. The process gas may be supplied into the process chamber 310

(S440), and the high frequency power may be provided to the lower electrode 322 (S450). The process gas supplied during the thin layer forming process may be supplied during the etching process. Alternatively, another process gas may be supplied to accurately control the etching of the material layer. For example, Ar gas may be supplied during the thin layer forming process, and He gas may be supplied during the etching process. The supply of the source gas may be stopped during the etching process. A first material layer pattern 135_1 may be formed in a lower portion of the gap region 132 using the etching process.

Referring to FIGS. 7, 8, and 9, the thin layer forming process and the etching process may be repeatedly performed to form a second material layer pattern 135_2 and a third material layer pattern 135_3 in the gap region 132. A thickness of the formed phase change material layer may increase as the thin layer forming process is repeatedly performed. That is, a thickness of the second material layer pattern 135_2 may be larger than a thickness of the first material layer pattern 135_1, and a thickness of the third material layer pattern 135_3 may be larger than the thickness of the second material layer pattern 135_2. The time periods of the thin layer forming process and the etching process may be determined considering a height and an aspect ratio of the gap region 132, the thickness of the formed phase change material layers, etc.

When the gap filling is completed (S460), the substrate support unit 320 may descend and be exposed to the atmosphere, and the wafer W may be unloaded from the substrate support unit 320 by the transfer robot (not shown) through the port 316 (S470).

The thin layer forming process and the etching process may be performed in situ in the same plasma processing apparatus. Therefore, the thin layer forming process and the etching process may be quickly performed.

FIGS. 10 through 15 illustrate sectional views of stages of a method for forming a semiconductor memory device according to an embodiment of the present invention. The aforementioned gap filling method may be used in the method for forming a semiconductor memory device.

Figure 10:
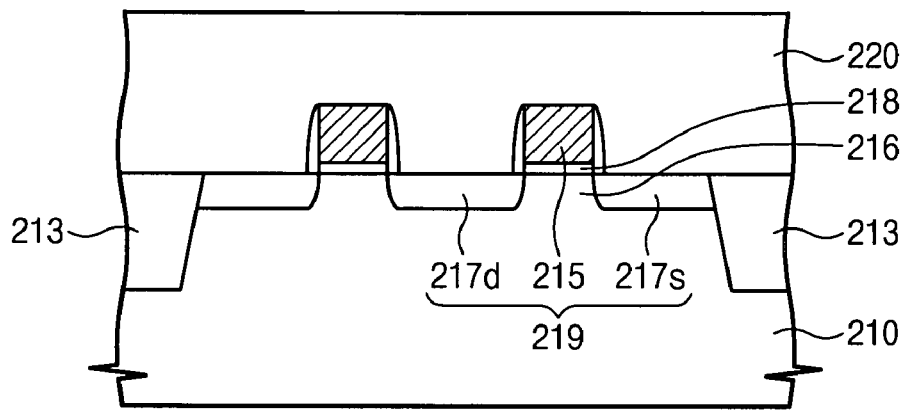
FIGS. 10 through 15 illustrate sectional views of stages of a method for forming a semiconductor memory device according to an embodiment of the present invention.

Referring to FIG. 10, device isolation regions 213 and a transistor 219 may be formed on a semiconductor substrate 210. The device isolation regions 213, which are insulating regions formed in the semiconductor substrate 210, may define an active region. The device isolation regions 213 may be formed using a trench process such as shallow trench isolation (STI). The transistor 219 may include a gate electrode 215 formed on the semiconductor substrate 210 extending in a predetermined direction. A source region 217s and a drain region 217d may be formed on both sides of the gate electrode 215 in an active region of the semiconductor substrate 210. The active region between the source region 217s and the drain region 217d, i.e., the active region under the gate electrode 215, may be a channel region 216 which functions as a current path between the source region 217s and the drain region 217d. A gate insulating layer 218 may be located between the gate electrode 215 and the channel region 216. A first interlayer insulating layer 220 may be formed to completely cover the transistor 219. The first interlayer insulating layer 220 may be formed of a silicon oxide layer formed using, e.g., chemical vapor deposition (CVD), etc.

Figure 11:
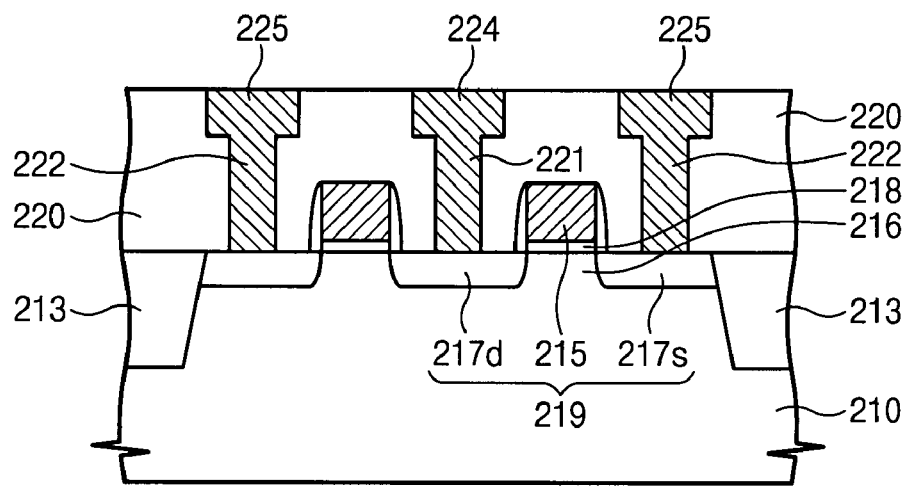

Referring to FIG. 11, a contact plug 221 and a lower line 224 may be formed on the drain region 217d, and a contact plug 222 and a lower electrode 225 may be formed on the source region 217s. The lower line 224 may extend parallel to the gate electrode 215. The contact plugs 221 and 222, the lower line 224, and the lower electrode 225 may be formed of a conductive material by using various methods.

Figure 12:
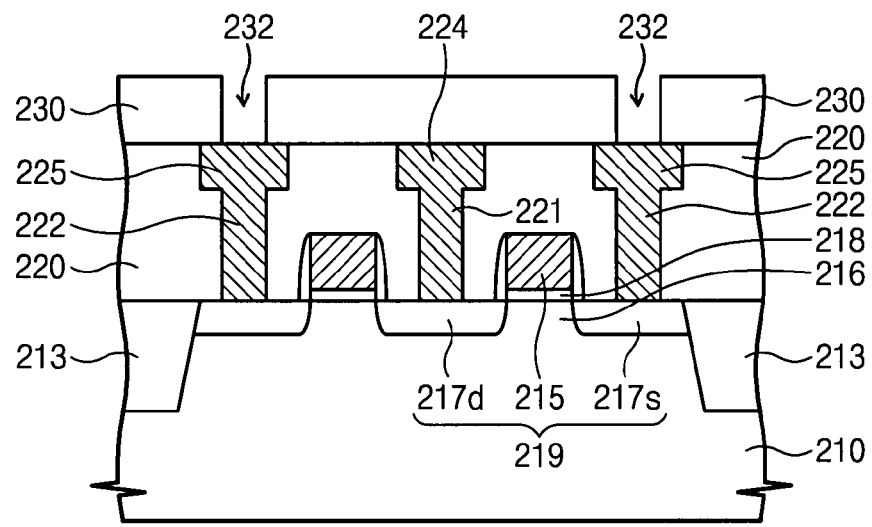

Referring to FIG. 12, a second insulating layer 230 may be formed on the lower line 224, the lower electrodes 225, and the first interlayer insulating layer 220. The second interlayer insulating layer 230 may be formed of silicon oxide using, e.g., CVD. The second interlayer insulating layer 230 may be patterned to form openings 232 exposing the lower electrodes 225. A width of the opening 232 may be smaller than a width of the lower electrode 225, e.g., about 100 nm or less.

Figure 13:
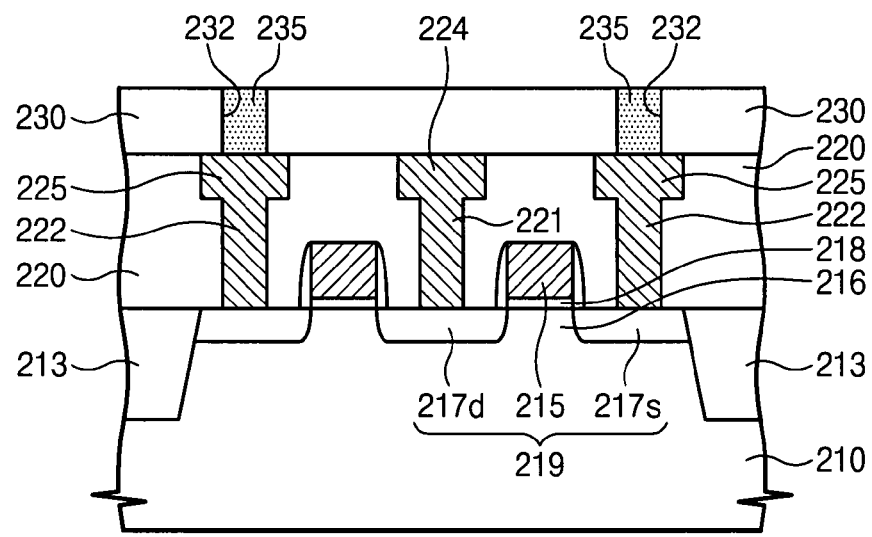

Referring to FIG. 13, phase change material layer patterns 235 may be formed in the openings 232. The phase change material layer patterns 235 may be formed using the gap filling method described with reference to FIGS. 5 through 9. That is, the thin layer forming process and the etching process may be repeatedly performed to form the phase change material layer patterns 235 in the openings 232. The phase change material layer patterns 235 may not completely fill the openings 232. The phase change material layer patterns 235 may function as a data storage layer. Since the phase change material layer patterns 235 are formed in the openings 232, a width of each phase change material layer pattern 235 may be, e.g., 100 nm or less. Therefore, the semiconductor memory device may be highly integrated. Also, a contact area between the phase change material layer patterns 235 and the lower electrodes 225 may be decreased, and the size of the phase change material layer patterns 235 may be decreased. Therefore, the phase change material constituting the phase change material layer patterns 235 may undergo the phase change into the crystalline state or the amorphous state using a low current, thus enhancing an operation characteristic of the semiconductor memory device.

Figure 14:
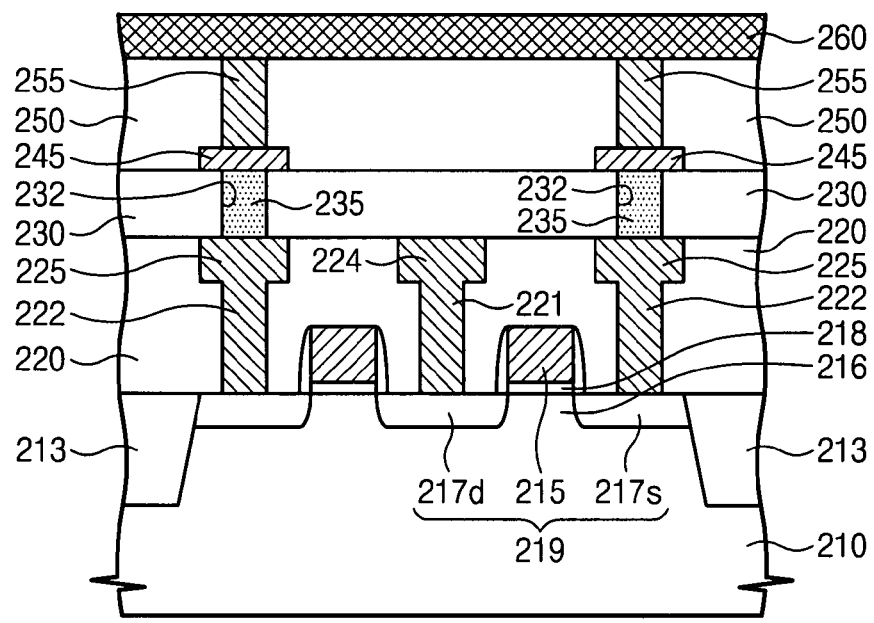

Referring to FIG. 14, a conductive layer may be formed on the phase change material layer patterns 235 and the second interlayer insulating layer 230 and may be patterned to form upper electrodes 245. The upper electrodes 245 may contact the phase change material layer patterns 235. Next, a third interlayer insulating layer 250 may be formed on the upper electrodes 245 and the second interlayer insulating layer 230. The second and third interlayer insulating layers 230 and 250 may be formed of silicon oxide using, e.g., CVD. Contact plugs 255 may be formed to penetrate the third interlayer insulating layer 250 and contact the upper electrodes 245. A conductive layer may be formed on the contact plugs 255 and the third interlayer insulating layer 250 and patterned to form an upper line 260.

Figure 15:
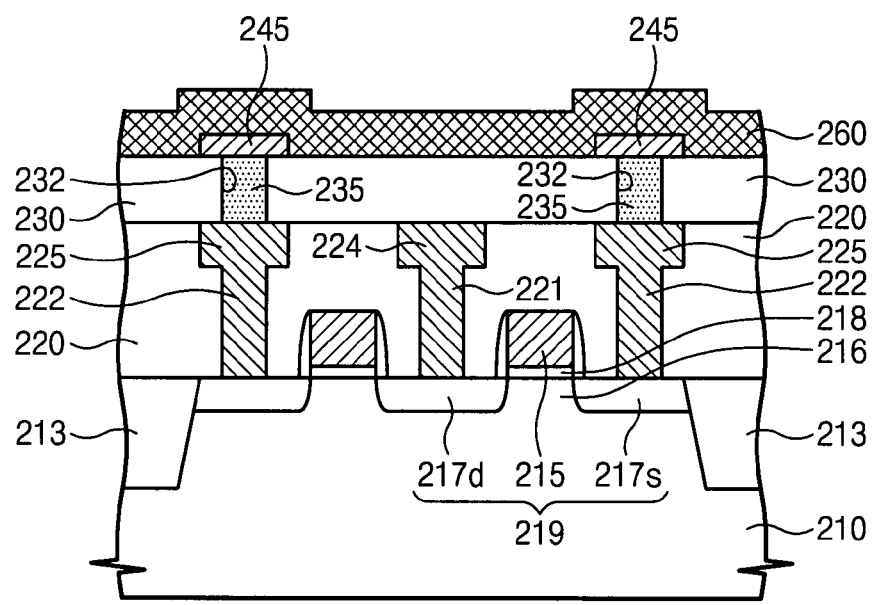

FIG. 15 illustrates a sectional view of a method for electrically connecting the upper line 260 with the upper electrode 245.

Referring to FIG. 15, the contact plugs for electrically connecting the upper electrodes 245 with the upper line 260 may not be formed, and the upper electrodes 245 may directly contact the upper line 260. The third interlayer insulating layer thus may not be formed. That is, a conductive layer may be formed on the upper electrodes 245 and the second interlayer insulating layer 230, and the conductive layer may be patterned to form the upper line 260.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for filling a gap, comprising:
   forming an insulating layer on a substrate;
   forming a gap region in the insulating layer; and
   forming a phase change material layer pattern in the gap region, the phase change material layer pattern including a plurality of sub phase change material layer patterns having a substantially flat surface, the sub phase change material layer patterns being sequentially stacked in the gap region,
   wherein the plurality of sub phase change material layer patterns are formed by repeatedly forming a phase change material layer and etching the phase change material layer in a plasma processing apparatus, and includes:
      supplying a process gas and a source gas to a process chamber of the plasma processing apparatus;
      independently supplying a voltage to an upper electrode and a lower electrode respectively located in an upper portion and a lower portion of the process chamber;
      providing a first power of about 100 W or less to the upper electrode and grounding the lower electrode during forming the phase change material layer; and
      providing a second power higher than the first power provided to the upper electrode to the lower electrode during etching the phase change material layer.

2. The method as claimed in claim 1, wherein the repeatedly forming the phase change material layer and etching the phase change material layer are performed in situ.

3. The method as claimed in claim 1, wherein a thickness of the phase change material layer pattern is increased with increasing repetitions of the forming the phase change material layer and etching the phase change material layer.

4. The method as claimed in claim 1, wherein sidewalls of the plurality of sub phase change material layer patterns are aligned with an inner sidewall of the gap region.

5. A method for forming a memory device, comprising:
   forming a first interlayer insulating layer having a conductive plug on a substrate;
   forming a second interlayer insulating layer on the first interlayer insulating layer;
   patterning the second interlayer insulating layer to form an opening exposing the conductive plug; and
   forming a phase change material layer pattern in the gap region, the phase change material layer pattern including a plurality of sub phase change material layer patterns having a substantially flat surface, the sub phase change material layer patterns being sequentially stacked in the gap region,
   wherein the plurality of sub phase change material layer patterns are formed by repeatedly forming a phase change material layer and etching the phase change material layer in a plasma processing apparatus, and includes
      supplying a process gas and a source gas to a process chamber of the plasma processing apparatus;
      independently supplying a voltage to an upper electrode and a lower electrode respectively located in an upper portion and a lower portion of the process chamber;
      providing a first power of about 100 W or less to the upper electrode and grounding the lower electrode during forming the phase change material layer; and
      providing a second power higher than the first power provided to the upper electrode to the lower electrode during etching the phase change material layer.

6. The method as claimed in claim 5, wherein the repeatedly forming the phase change material layer and etching the phase change material layer are performed in situ.

7. The method as claimed in claim 5, wherein a thickness of the formed phase change material layer pattern is increased with increasing repetitions of the forming the phase change material layer and etching the phase change material layer.

8. The method as claimed in claim 5, wherein the phase change material layer comprises at least one of Ge, Te, or Sb.

9. The method as claimed in claim 5, further comprising forming a plasma in the process chamber, wherein the process gas comprises at least one of Ar, He, or $H_2$.

10. The method as claimed in claim 5, wherein the process gas is used as an etching gas in the etching process.

11. The method as claimed in claim 5, wherein the source gas includes a first precursor comprising Ge, a second precursor comprising Sb, and a third precursor comprising Te.

12. The method as claimed in claim 11, wherein the first precursor comprises Ge(iso-butyl)$_3$H or GeH$_4$, the second precursor comprises Sb(iso-propyl)$_3$, and the third precursor comprises Te(t-butyl)$_3$.

13. The method as claimed in claim 11, wherein the source gas is repeatedly supplied in an order of the first precursor, the third precursor, the second precursor, and the third precursor.

14. The method as claimed in claim 5, wherein sidewalls of the plurality of sub phase change material layer patterns are aligned with an inner sidewall of the gap region.

* * * * *